(12) United States Patent
Liu et al.

(10) Patent No.: US 6,350,390 B1
(45) Date of Patent: Feb. 26, 2002

(54) PLASMA ETCH METHOD FOR FORMING PATTERNED LAYER WITH ENHANCED CRITICAL DIMENSION (CD) CONTROL

(75) Inventors: Chi Kang Liu, Ping Zhen; Chang Jen Shieh; Pei Hung Chen, both of Hsin-Chu, all of (TW)

(73) Assignee: Taiwan SEmiconductor Manufacturing Company, LTD, Hsin Chu (TW)

( * ) Notice: Subject to any disclaimer, the term of this patent is extended or adjusted under 35 U.S.C. 154(b) by 0 days.

(21) Appl. No.: 09/507,808

(22) Filed: Feb. 22, 2000

(51) Int. Cl.$^7$ ................................................ G05D 5/00
(52) U.S. Cl. .............................. 216/59; 216/67; 438/9; 438/714; 438/717; 700/118; 700/266; 700/303; 700/121
(58) Field of Search .............................. 216/49, 59, 67; 438/9, 14, 714, 717; 700/117, 118, 119, 121, 266, 303

(56) References Cited

U.S. PATENT DOCUMENTS

| | | | |
|---|---|---|---|
| 5,427,878 A | | 6/1995 | Corlis ........................ 430/30 |
| 5,637,186 A | | 6/1997 | Liu et al. .................... 438/14 |
| 5,655,110 A | | 8/1997 | Krivokapic et al. ........ 395/500 |
| 5,773,174 A | | 6/1998 | Koizumi et al. ............. 430/30 |
| 5,798,529 A | * | 8/1998 | Wagner .................... 250/492.2 |
| 5,913,102 A | | 6/1999 | Yang ......................... 438/14 |
| 5,926,690 A | | 7/1999 | Toprac et al. ............... 438/17 |
| 5,953,128 A | * | 9/1999 | Auschnitt et al. ........... 356/399 |
| 5,985,498 A | * | 11/1999 | Levinson et al. ............ 430/30 |
| 6,128,089 A | * | 10/2000 | Auschnitt et al. ........... 356/401 |
| 6,136,478 A | * | 10/2000 | Usui et al. .................. 430/5 |
| 6,162,696 A | * | 12/2000 | Cheng et al. ............... 438/312 |
| 6,245,581 B1 | * | 6/2001 | Bonser et al. ............... 438/8 |

\* cited by examiner

*Primary Examiner*—Randy Gulakowski
*Assistant Examiner*—Allan Olsen
(74) *Attorney, Agent, or Firm*—Tung & Associates

(57) ABSTRACT

A feed forward method for forming within a microelectronic fabrication a patterned target layer with controlled critical dimension (CD) first provides a substrate having formed thereover a blanket target layer, in turn having formed thereover a blanket anti-reflective coating (ARC) layer, in turn having formed thereover a paltered photoresist layer. There is then established a correlation which describes an interrelation between the patterned photoresist layer linewidth and a plasma species concentration within a plasma for forming from the blanket anti-reflective coating (ARC) layer a patterned anti-reflective coating (ARC) layer such that a patterned target layer subsequently formed from the blanket target layer is formed with a patterned target layer measured linewidth closer to a patterned target layer target linewidth The linewidth of the patterned photoresist layer is then measured and there is determined a deviation of the patterned photoresist measured linewidth from a patterned photoresist layer target linewidth. The plasma species concentration is then adjusted when etching the blanket anti-reflective coating (ARC) layer to form the patterned anti-reflective coating (ARC) layer such that the patterned target layer may be formed with the patterned target layer measured linewidth closer to a patterned target layer target linewidth.

16 Claims, 3 Drawing Sheets

PLASMA ETCH METHOD FOR FORMING PATTERNED LAYER WITH ENHANCED CRITICAL DIMENSION (CD) CONTROL

BACKGROUND OF THE INVENTION

1. Field of the Invention

The present invention relates generally to methods for forming patterned layers within microelectronic fabrications. More particularly, the present invention relates to methods for forming, with enhanced critical dimension (CD) control, patterned layers within microelectronic fabrications.

2. Description of the Related Art

Microelectronic fabrications are formed from microelectronic substrates over which are formed patterned microelectronic conductor layers which are separated by microelectronic dielectric layers.

As microelectronic fabrication integration levels have increased and microelectronic device and patterned microelectronic conductor layer dimensions have decreased, it has become increasingly important within the art of microelectronic fabrication to monitor and control the critical dimension (CD) of microelectronic devices and patterned microelectronic layers when fabricating microelectronic fabrications. In particular, enhanced critical dimension (CD) control is significant when forming microelectronic devices and patterned microelectronic layers when fabricating microelectronic fabrications since enhanced critical dimension (CD) control typically provides microelectronic fabrications fabricated with enhanced functionality, enhanced reliability and/or enhanced yield.

While enhanced critical dimension (CD) control is thus desirable in the art of microelectronic fabrication when forming microelectronic devices and patterned microelectronic layers within microelectronic fabrications, enhanced critical dimension (CD) control is nonetheless not obtained entirely without problems in the art of microelectronic fabrication when forming microelectronic devices and patterned microelectronic conductor layers within microelectronic fabrications. In that regard, it is often difficult to provide within microelectronic fabrications microelectronic devices and patterned microelectronic layers with enhanced critical dimension (CD) control insofar as there often occurs when forming a microelectronic device or a patterned microelectronic layer within a microelectronic fabrication multiple interrelated parameters which affect the critical dimension (CD) of the microelectronic device or the patterned microelectronic layer within the microelectronic fabrication.

It is thus towards the goal of forming within the art of microelectronic fabrication patterned microelectronic layers, such as but not limited to patterned microelectronic layers which may be formed within microelectronic devices, with enhanced critical dimension (CD) control, that the present invention is directed.

Various methods have been disclosed in the art of microelectronic fabrication for monitoring and/or controlling the critical dimension (CD) of patterned layers formed within microelectronic fabrications.

For example, Corliss, in U.S. Pat. No. 5,427,878 discloses a microelectronic fabrication method which provides for enhanced across-wafer critical dimension (CD) monitoring when fabricating a microelectronic fabrication while employing the microelectronic fabrication method. The microelectronic fabrication method is an optical endpoint detection microelectronic fabrication method which employs in conjunction with a series of critical dimension (CD) test locations spaced across a microelectronic substrate a series of optical detectors positioned corresponding with each of the series of critical dimension (CD) test locations, and where one of the series of critical dimension (CD) test locations is a control critical dimension (CD) test location an optical endpoint detection monitoring of which is employed for controlling processing of the substrate, while the remainder of the series of critical dimension (CD) test locations comprise monitor critical dimension (CD) test locations which provide across-substrate critical dimension (CD) information when processing the substrate while employing the microelectronic fabrication method.

In addition, Liu et al, in U.S. Pat. No. 5,637,186, disclose a monitor test site pattern, and a method which employs the monitor test site pattern when monitoring a microelectronic device critical dimension (CD) when fabricating a microelectronic fabrication while employing the monitor test site pattern, where the monitor test site pattern and the method which employs the monitor testsite pattern provide enhanced accuracy when monitoring the microelectronic device critical dimension (CD) when fabricating the microelectronic device while employing the method which employs the monitor test site pattern. To realize the foregoing result, the monitor test site pattern is fabricated employing layers and dimensions which match the configurations and thicknesses of layers and dimensions employed when fabricating functional microelectronic devices and patterned microelectronic layers within the microelectronic fabrication within which is employed the monitor test site pattern.

Further, Krivokapic et al., in U.S. Pat. No. 5,655,110, disclose a method for providing, with enhanced microelectronic fabrication ease and enhanced microelectronic fabrication efficiency, enhanced critical dimension (CD) control when forming within a microelectronic fabrication a microelectronic device or patterned microelectronic layer while employing a microelectronic fabrication method. To realize the foregoing result, the method provides a computer implemented method which among other features: (1) first statistically determines from a plurality of microelectronic fabrication process parameters within the microelectronic fabrication method those microelectronic fabrication process parameters which provide a most prominent contribution to critical dimension (CD) of a microelectronic device or patterned microelectronic layer formed employing the microelectronic fabrication method; and (2) then determines while employing the most prominent process parameters process parameter adjustments which provide for enhanced critical dimension (CD) control of the microelectronic device or patterned microelectronic layer formed while employing the microelectronic fabrication method.

Still further, Koizumi et al., in U.S. Pat. No. 5,773,174, disclose a method for forming from a blanket photoresist layer within a microelectronic fabrication a patterned photoresist layer with enhanced critical dimension (CD) control within the microelectronic fabrication, without employing a light diffraction method when forming from the blanket photoresist layer within the microelectronic fabrication the patterned photoresist layer with the enhanced critical dimension (CD) control within the microelectronic fabrication. In order to realize the foregoing object, the method employs: (1) measurement within a photoexposed blanket photoresist layer within the microelectronic fabrication while employing an atomic force microscopy (AFM) method a latent photoexposed image height within the photoexposed blanket photoresist layer, in conjunction with; (2) correlation with, and control of, a development time when developing from the photoexposed blanket photoresist layer the patterned photoresist layer to provide the patterned photoresist layer with the enhanced critical dimension (CD) control.

Still yet further, Yang, in U.S. Pat. No. 5,913,102, also disclose a method for forming within a microelectronic fabrication a patterned photoresist layer with enhanced critical dimension (CD) control for use when subsequently forming within the microelectronic fabrication a patterned microelectronic layer with enhanced critical dimension (CD) control. To realize the foregoing result, the method employs when forming the patterned photoresist layer from a blanket photoresist layer measurement of a measurement parameter and subsequent control of a control parameter based upon a measured value of the measurement parameter, each of which measurement parameter and control parameter is independently correlated with the patterned photoresist layer critical dimension (CD) to provide when forming the patterned photoresist layer from the blanket photoresist layer the patterned photoresist layer with the enhanced critical dimension (CD) control.

Finally, Toprac et al., in U.S. Pat. No. 5,926,690, also disclose a method for forming within a microelectronic fabrication from a blanket microelectronic layer a patterned microelectronic layer with enhanced critical dimension (CD) control. To realize the foregoing result, the method employs a two step method for forming from a blanket photoresist layer a patterned photoresist etch mask layer for use when etching from the blanket microelectronic layer the patterned microelectronic layer with the enhanced critical dimension (CD) control, where the first step within the two step method provides for an inadequate development of the patterned photoresist layer from the blanket photoresist layer and a second step within the two step method provides for an additional etching of the inadequately developed patterned photoresist layer to provide a fully patterned photoresist layer.

Desirable in the art of microelectronic fabrication are additional methods and materials which may be employed for forming within microelectronic fabrications microelectronic devices and patterned microelectronic layers with enhanced critical dimension control.

It is towards the foregoing object that the present invention is directed.

SUMMARY OF THE INVENTION

A first object of the present invention is to provide a method for forming within a microelectronic fabrication a patterned microelectronic layer.

A second object of the present invention is to provide a method in accord with the first object of the present invention, where the patterned microelectronic layer is formed with enhanced critical dimension (CD) control.

A third object of the present invention is to provide a method in accord with the first object of the present invention and the second object of the present invention, which method is readily commercially implemented.

In accord with the objects of the present invention, there is provided by the present invention a method for forming within a microelectronic fabrication a patterned layer. To practice a first embodiment of the present invention, there is first provided a stack comprising a substrate, where the substrate has formed thereover a blanket target layer, where the blanket target layer in turn has formed thereover a blanket organic anti-reflective coating (ARC) layer, and where the blanket organic anti-reflective coating (ARC) layer in turn has formed thereover a patterned photoresist layer. There is then established for the stack a correlation which interrelates a patterned photoresist layer target linewidth and an oxygen containing species target concentration in a fashion to provide a patterned target layer having a patterned target layer target linewidth within a sequence of: (1) a first plasma etch method for forming from the blanket organic anti-reflective coating (ARC) layer a patterned organic anti-reflective coating (ARC) layer while employing a first etchant gas composition which upon plasma activation provides the oxygen containing species; and (2) a second plasma etch method for forming the blanket target layer the patterned target layer. There is then determined for the patterned photoresist layer a patterned photoresist layer measured linewidth and a deviation of the patterned photoresist layer measured linewidth from the patterned photoresist layer target linewidth. There is then etched, while employing the first plasma etch method, the blanket organic anti-reflective coating (ARC) layer to form the patterned organic anti-reflective coating (ARC) layer, where the oxygen containing species concentration within the first plasma etch method is adjusted within the context of the correlation to compensate for the deviation of the patterned photoresist layer measured linewidth from the patterned photoresist layer target linewidth such that the blanket target layer may be etched while employing the second plasma etch method to form the patterned target layer having a patterned target layer measured linewidth closer to the patterned target layer target linewidth. Finally, there is then etched, while employing the second plasma etch method, the blanket target layer to form the patterned target layer.

A second embodiment of the present invention follows analogously with the first embodiment of the present invention, but: (1) employs in place of the blanket organic anti-reflective coating (ARC) layer a blanket silicon containing dielectric anti-reflective coating (ARC) layer; and (2) employs in place of the oxygen containing species within the first etchant gas composition for etching the blanket organic anti-reflective coating (ARC) layer to form the patterned organic anti-reflective coating (ARC) layer a bromine containing species within the first etchant gas composition for etching the blanket silicon containing dielectric anti-reflective coating (ARC) layer to form a patterned silicon containing dielectric anti-reflective coating (ARC) layer.

The present invention provides a method for forming within a microelectronic fabrication a patterned layer, where the patterned layer is formed with enhanced critical dimension (CD) control. With a first embodiment, the present invention realizes the foregoing objects by employing when fabricating the patterned layer from a blanket target layer formed beneath a blanket organic anti-reflective coating (ARC) layer in turn formed beneath a patterned photoresist layer within a microelectronic fabrication a correlation which interrelates a patterned photoresist layer target linewidth and an oxygen containing species target concentration in a fashion to provide a patterned target layer having a patterned target layer target linewidth within a sequence of: (1) a first plasma etch method for forming from the blanket organic anti-reflective coating (ARC) layer a patterned organic anti-reflective coating (ARC) layer while employing a first etchant gas composition which upon plasma activation provides the oxygen containing species; and (2) a second plasma etch method for forming the blanket target layer the patterned target layer. The correlation may then be employed for compensating for a deviation of a patterned photoresist layer measured linewidth from the patterned photoresist layer target linewidth by adjusting an oxygen containing species concentration within the first plasma etch method from the oxygen containing species target concentration such that a patterned target layer measured linewidth is closer to the patterned target layer target linewidth.

Within a second embodiment of the invention an analogous result is realized by adjusting within the context of an analogous correlation a bromine containing species concentration within a first plasma etch method to compensate for a deviation of the patterned photoresist layer measured linewidth from the patterned photoresist layer target linewidth under circumstances where there is formed beneath the patterned photoresist layer a blanket silicon containing dielectric anti-reflective coating (ARC) layer rather than the blanket organic anti-reflective coating (ARC) layer.

The method of the present invention is readily commercially implemented. The present invention employs methods and materials as are otherwise generally known in the art of microelectronic fabrication, but employed within the context of a specific materials selection, process ordering and process control to provide the present invention. Since it is a process ordering and process control within the context of a materials selection which provides at least in part the present invention, rather than the existence of methods and materials which provides the present invention, the method of the present invention is readily commercially implemented.

BRIEF DESCRIPTION OF THE DRAWINGS

The objects, features and advantages of the present invention are understood within the context of the Description of the Preferred Embodiments, as set forth below. The Description of the Preferred Embodiments is understood within the context of the accompanying drawings, which form a material part of this disclosure, wherein.

DESCRIPTION OF THE PREFERRED EMBODIMENTS

Figure 1:
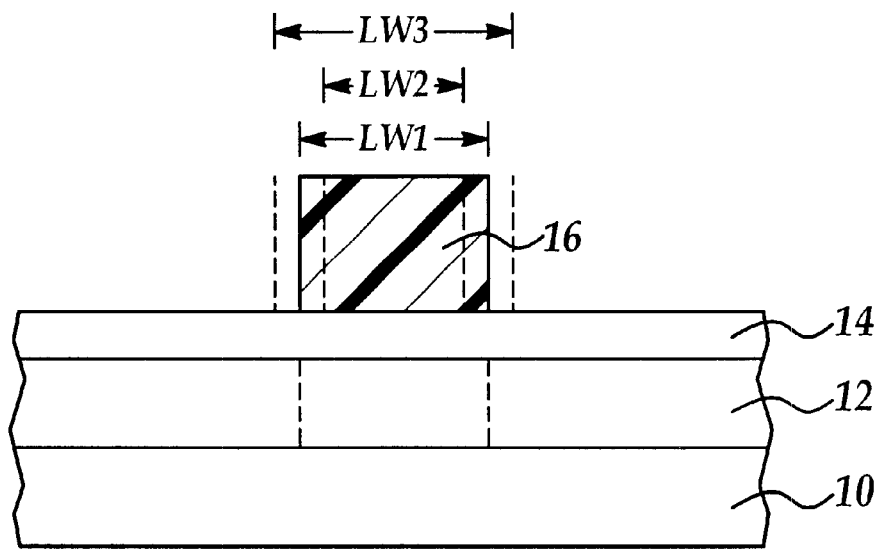
FIG. 1, FIG. 2 and FIG. 3 show a series of schematic cross-sectional diagrams illustrating the results of progressive stages of forming in accord with the preferred embodiments of the present invention a patterned target layer within a microelectronic fabrication.

The present invention provides a method for forming within a microelectronic fabrication a patterned layer, where the patterned layer is formed with enhanced critical dimension (CD) control. With a first embodiment, the present invention realizes the foregoing objects by employing when fabricating the patterned layer from a blanket target layer formed beneath a blanket anti-reflective coating (ARC) layer in turn formed beneath a patterned photoresist layer within a microelectronic fabrication a correlation which interrelates a patterned photoresist layer target linewidth and an oxygen containing species target concentration in a fashion to provide a patterned target layer having a patterned target layer target linewidth within a sequence of: (1) a first plasma etch method for forming from the blanket organic anti-reflective coating (ARC) layer a patterned organic anti-reflective coating (ARC) layer while employing a first etchant gas composition which upon plasma activation provides the oxygen containing species; and (2) a second plasma etch method for forming from the blanket target layer the patterned target layer. The correlation may then be employed for compensating for a deviation of a patterned photoresist layer measured linewidth from the patterned photoresist layer target linewidth by adjusting within the first plasma etch method an oxygen containing species concentration from the oxygen containing species target concentration such that a patterned target layer measured linewidth is closer to the patterned target layer target linewidth.

Within a second embodiment of the invention an analogous result is realized by adjusting within the context of an analogous correlation a bromine containing species concentration within a first plasma etch method to compensate for a deviation of the patterned photoresist layer measured linewidth from the patterned photoresist layer target linewidth under circumstances where there is formed beneath the patterned photoresist layer a blanket silicon containing dielectric anti-reflective coating (ARC) layer rather than a blanket organic antireflective coating (ARC) layer.

Although the present invention provides particular value when forming with enhanced critical dimension (CD) control for use within a semiconductor integrated circuit microelectronic fabrication a patterned polysilicon layer for use as a gate electrode within a field effect transistor (FET) for use within the semiconductor integrated circuit microelectronic fabrication., or in the alternative in forming with enhanced critical dimension (CD) control a patterned conductor layer for use within any of various types of microelectronic fabrications, the present invention may be employed for forming with enhanced critical dimension (CD) control patterned target layers including but not limited to patterned conductor target layers, patterned semiconductor target layers and patterned dielectric target layers within microelectronic fabrications including but not limited to integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

Figure 2:
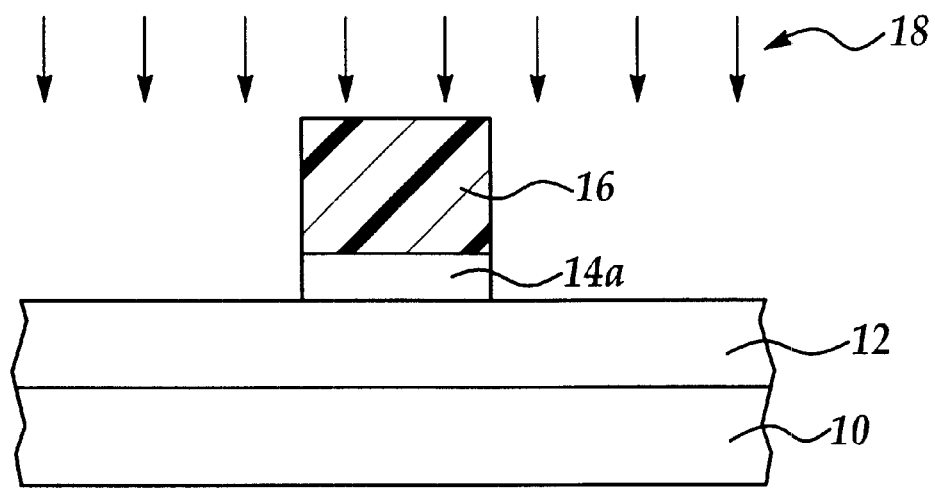
Figure 3:
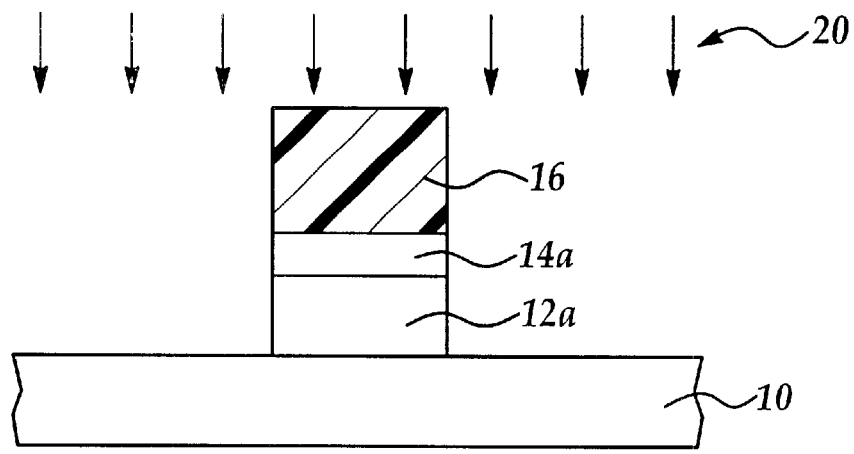

Referring now to FIG. 1 to FIG. 3, there is show a series of schematic cross-sectional diagrams illustrating the results of progressive stages of fabrication in accord with a preferred embodiment of the present invention a patterned microelectronic layer within the microelectronic fabrication. Shown in FIG. 1 is a schematic cross-sectional diagram of the microelectronic fabrication at an early stage in its fabrication in accord with the preferred embodiment of the present invention.

Shown in FIG. 1 is a substrate 10 having formed thereover a blanket target layer 12, in turn having formed thereover a blanket anti-reflective coating layer 14, in turn having formed thereover a patterned photoresist layer 16.

Within the preferred embodiment of the present invention with respect to the substrate 10, the substrate 10 may comprise a substrate as employed within a microelectronic fabrication selected from the group including but not limited to integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

Although not specifically illustrated within the schematic cross-sectional diagram of FIG. 1, the substrate 10 may consist of the substrate alone as employed within the microelectronic fabrication, or in the alternative, the substrate 10 may comprise the substrate as employed within the microelectronic fabrication, where the substrate has formed thereupon and/or thereover any of several additional microelectronic layers as are conventional within the microelectronic fabrication within which is employed the substrate. Similarly with the substrate alone as employed within the microelectronic fabrication, such additional microelectronic layers may be formed of microelectronic materials including but not limited to microelectronic conductor materials, microelectronic semiconductor materials and microelectronic dielectric materials.

Similarly, although also not specifically illustrated within the schematic cross-sectional diagram of FIG. 1, the substrate 10, typically and preferably when the substrate 10 comprises a semiconductor substrate employed within a semiconductor integrated circuit microelectronic fabrication, has formed therein and/or thereupon microelectronic devices as are conventional within the microelectronic fabrication within which is employed the substrate 10. The microelectronic devices may include, but are not limited to resistors, transistors, diodes and capacitors.

Most typically and preferably, but not exclusively, within the preferred embodiment of the present invention the substrate 10 either consists of or comprises a semiconductor substrate employed within a semiconductor integrated circuit microelectronic fabrication.

Within the preferred embodiment of the present invention with respect to the blanket target layer 12, and analogously with the substrate 10, the blanket target layer 12 may similarly also be formed from a microelectronic material selected from the group including but not limited to microelectronic conductor materials, microelectronic semiconductor materials and microelectronic dielectric materials. However, within the preferred embodiment of the present invention when the substrate 10 consists of or comprises a semiconductor substrate employed within a semiconductor integrated circuit microelectronic fabrication, the blanket target layer 12 will most typically and preferably be formed of a conductor target material, such as but not limited to a doped polysilicon having a dopant concentration of greater than about 1E18 dopant atoms per cubic centimeter, polycide (doped polysilicon/metal silicide stack), metal or metal alloy conductor target material. Typically and preferably, the blanket target layer 12 is formed to a thickness of from about 2000 to about 8000 angstroms.

Within the preferred embodiments of the present invention with respect to the blanket anti-reflective coating (ARC) layer 14, the blanket anti-reflective coating (ARC) layer may in general be formed from anti-reflective coating (ARC) materials as are conventional in the art of microelectronic fabrications, including but not limited to: (1) organic anti-reflective coating (ARC) materials, such as but not limited to amorphous carbon anti-reflective coating (ARC) materials and organic polymer anti-reflective coating (ARC) materials (such as but not limited to polyimide organic polymer anti-reflective coating (ARC) materials, polysulfone anti-reflective coating (ARC) materials); and (2) silicon containing dielectric anti-reflective coating (ARC) materials, such as but not limited to silicon oxide anti-reflective coating (ARC) materials, silicon nitride anti-reflective coating (ARC) materials and silicon oxynitride anti-reflective coating (ARC) materials. Typically and preferably, the blanket anti-reflective coating (ARC) layer 14 when formed of an organic anti-reflective coating (ARC) material, and in particular an organic polymer anti-reflective coating (ARC) material is formed to a thickness of from about 1300 to about 2000 angstroms. Similarly, typically and preferably the blanket anti-reflective coating (ARC) layer 14 when formed of a silicon containing dielectric anti-reflective coating (ARC) material is formed to a thickness of from about 280 to about 400 angstroms.

Finally, within the preferred embodiment of the present invention with respect to the patterned photoresist layer 16, the patterned photoresist layer 16 may be formed of photoresist materials as are conventional in the art of microelectronic fabrication, including but not limited to photoresist materials selected from the general groups of photoresist materials including but not limited to positive photoresist materials and negative photoresist materials. For the preferred embodiment of the present invention, the patterned photoresist layer 16 is formed to a thickness of from about 5000 to about 12000 angstroms.

As is also illustrated within the schematic cross-sectional diagram of FIG. 1, the patterned photoresist layer 16 has at least a single directional target linewidth LW1 of from about 0.15 to about 0.5 microns, but it is also typically encountered within the art of microelectronic fabrication that the target linewidth LW1 will have an offset to provide a comparatively narrower linewidth LW2 of from about 0.13 to about 0.48 microns or a comparatively wider linewidth LW3 of from about 0.17 to about 0.52 microns. Such an offset within the patterned photoresist layer 16 target linewidth LW1 is typically observed incident to variation of process parameters within photolithographic and development processes which are employed for forming the patterned photoresist layer 16 from a corresponding blanket photoresist layer.

Within the present invention and the preferred embodiments of the present invention, the patterned photoresist layer 16 target linewidth LW1 will correlate with a patterned target layer target linewidth of a patterned target layer formed from the blanket target layer 12. Similarly, it is the intention of the present invention and the preferred embodiments of the present invention to compensate for a deviation of the patterned photoresist layer 16 from the patterned photoresist layer 16 target linewidth LW1 by: (1) establishing a correlation relating the patterned photoresist layer 16 linewidth and a parameter employed in forming a patterned anti-reflective coating (ARC) layer from the blanket anti-reflective coating (ARC) layer 14 to the patterned target layer linewidth; (2) measuring the patterned photoresist layer 16 linewidth and comparing the patterned photoresist layer 16 measured linewidth to the patterned photoresist layer 16 target linewidth LW1 and determining a deviation therebetween; and (3) adjusting the parameter employed in forming the patterned anti-reflective (ARC) coating layer from the blanket anti-reflective coating (ARC) layer 14 such that the patterned target layer is formed with a patterned target layer measured linewidth closer to the patterned target layer target linewidth. Thus, within the present invention and the first preferred embodiment of the present invention, in conjunction with independently determined the foregoing correlation, the patterned photoresist layer 16 linewidth is measured and its deviation from the patterned photoresist layer 16 target linewidth LW1 is determined.

Referring now to FIG. 2, there is shown a schematic cross-sectional diagram illustrating the results of further processing of the microelectronic fabrication whose schematic cross-sectional diagram is illustrated in FIG. 1.

Shown in FIG. 2 is a schematic cross-sectional diagram of a microelectronic fabrication otherwise equivalent to the microelectronic fabrication whose schematic cross-sectional diagram is illustrated in FIG. 1, but wherein the blanket anti-reflective coating (ARC) layer 14 has been patterned to form a patterned anti-reflective coating (ARC) layer 14a while employing the patterned photoresist layer 16 as an etch mask layer, in conjunction with use of a first etching plasma 18, wherein an appropriate parameter within the first etching plasma 18 is adjusted to compensate for the deviation of the patterned photoresist layer 16 measured linewidth from the patterned photoresist layer 16 target linewidth LW1 such that a patterned target layer when subsequently formed from the blanket target layer 12 may be formed with a patterned target layer measured linewidth closer to the patterned target layer target line width.

Within the preferred embodiment of the present invention under circumstances where the blanket anti-reflective coating (ARC) layer 14 is formed from the organic polymer anti-reflective coating (ARC) material, the first etching plasma 1 8 typically and preferably employs an etchant gas composition which upon plasma activation provides an active bromine containing species and an active oxygen containing species, along with other optional reactive and diluent species, and it is the active oxygen containing species which is preferably adjusted within the context of the deviation of the patterned photoresist layer 16 measured linewidth and the patterned photoresist layer 16 target linewidth LW1 to ultimately provide the patterned target layer with the patterned target layer measured linewidth closer to the patterned target layer target linewidth. Typically and preferably, the active bromine containing species derives from a bromine containing gas selected from the group including but not limited to bromine and hydrogen bromide, and more typically and preferably hydrogen bromide, while the active oxygen containing species derives from an oxygen containing gas selected from the group including but not limited to oxygen, ozone, nitrous oxide and nitric oxide, and more preferably oxygen. Similarly, typically and preferably, the etchant gas composition also comprises a minor concentration of nitrogen.

Similarly, when etching the blanket anti-reflective coating (ARC) layer 14 formed of the organic anti-reflective coating (ARC) material to form the patterned anti-reflective coating (ARC) layer 14a upon an 8" substrate 10, a first plasma etch method which employs the first etching plasma 18 also employs: (1) a reactor chamber pressure of from about 4 to about 20 mtorr; (2) a source radio frequency power of from about 150 to about 300 watts a source radio frequency of 13.56 MHZ and a bias power of from about 50 to about 250 watts; (3) a substrate 10 temperature of from about 60 to about 80 degrees centigrade; (4) a hydrogen bromide flow rate of from about 40 to about 100 standard cubic centimeters per minute (sccm); (5) an oxygen target flow rate of from about 8 to about 12 standard cubic centimeters per minute (sccm) with an adjustment of from about +2 to about −2 standard cubic centimeters per minute (sccm) to compensate for variations of the patterned photoresist layer 16 measured linewidth from the patterned photoresist layer 16 target linewidth LW1; and (6) a nitrogen flow rate of from about 4 to about 8 standard cubic centimeters per minute (sccm).

Within the preferred embodiment of the present invention under circumstances where the blanket anti-reflective coating (ARC) layer 14 is formed from the silicon containing dielectric anti-reflective coating (ARC) material, the first plasma 18 typically and preferably employs an etchant gas composition which upon plasma activation provides an active fluorine containing species and an active bromine containing species, along with other optional reactive and diluent species, and it is the active bromine containing species which is preferably adjusted within the context of the deviation of the patterned photoresist layer 16 measured linewidth and the patterned photoresist layer 16 target linewidth LW1 to ultimately provide the patterned target layer with the patterned target layer measured linewidth closer to the patterned target layer target linewidth. Typically and preferably, the active bromine containing species derives from a bromine containing gas selected from the group including but not limited to bromine and hydrogen bromide, and more typically and preferably hydrogen bromide, while the active fluorine containing species derives from a fluorine containing gas selected from the group including but not limited to perfluorocarbons of up to about 4 carbon atoms, hydrofluorocarbons of up to about 4 carbon atoms, nitrogen trifluoride and sulfur hexafluoride, and more typically and preferably a perfluorocarbon. Similarly, typically and preferably, the etchant gas composition also comprises a minor concentration of helium and oxygen.

Similarly, when etching the blanket anti-reflective coating (ARC) layer 14 formed of the silicon containing dielectric anti-reflective coating (ARC) material to form the patterned anti-reflective coating (ARC) layer 14a upon an eight inch diameter substrate 10, a first plasma etch method which employs the first etching plasma 18 also employs: (1) a reactor chamber pressure of from about 8 to about 12 mtorr; (2) a source radio frequency power of from about 250 to about 400 watts a source radio frequency of 13.56 MHZ and a bias power of from about 60 to about 100 watts; (3) a substrate 10 temperature of from about 60 to about 80 degrees centigrade; (4) a hexafluoroethane flow rate of from about 60 to about 100 standard cubic centimeters per minute (sccm); (5) a hydrogen bromide target flow rate of from about 20 to about 25 standard cubic centimeters per minute (sccm) with an adjustment of from about +15 to about −20 standard cubic centimeters per minute (sccm) to compensate for variations of the patterned photoresist layer 16 measured linewidth from the patterned photoresist layer 16 target linewidth LW1; and (6) a helium:oxygen (80:20 vol:vol) mixture flow rate of from about 8 to about 12 standard cubic centimeters per minute (sccm).

Referring now to FIG. 3, there is shown a schematic cross-sectional diagram illustrating the results of further processing of the microelectronic fabrication whose schematic cross-sectional diagram is illustrated in FIG. 2.

Shown in FIG. 3 is a schematic cross-sectional diagram of a microelectronic 1.0 fabrication otherwise equivalent to the microelectronic fabrication whose schematic cross-sectional diagram is illustrated in FIG. 2., but wherein the blanket target layer 12 has been patterned to form a patterned target layer 12a while employing at least the patterned anti-reflective coating layer 14a as a second etch mask layer, in conjunction with a second etching plasma 20.

Within the preferred embodiment of the present invention, when the blanket target layer 12 is formed from a microelectronic conductor material, such as but not limited to a doped polysilicon, polycide, metal (in particular aluminum) or metal alloy (in particular aluminum alloy) conductor material, the second etching plasma 20 will typically and preferably employ an etchant gas composition which upon plasma activation provides an active chlorine containing etchant species. Typically and preferably, the etchant gas composition comprises chlorine or hydrogen chloride.

Upon forming the microelectronic fabrication whose schematic cross-sectional diagram is illustrated in FIG. 3, there is formed a microelectronic fabrication having formed therein a patterned target layer with enhanced critical dimension (CD) control. The patterned target layer is formed with enhanced critical dimension (CD) control by employing when forming the patterned target layer while employing a patterned photoresist layer formed upon a blanket anti-reflective coating (ARC) layer in turn formed upon a blanket target layer from which is formed the patterned target layer a compensation for a deviation of the patterned photoresist layer measured linewidth from a patterned photoresist layer target linewidth through correlation with and adjustment of a blanket anti-reflective coating (ARC) layer plasma etchant concentration.

EXAMPLES

In order to demonstrate the value of the present invention when forming a patterned target layer from a blanket target layer in conjunction with an anti-reflective coating (ARC) layer formed of an organic polymer anti-reflective coating (ARC) material, there was fabricated a series of microelectronic fabrications in accord with the schematic cross-sectional diagram of FIG. 1. The series of microelectronic fabrications employed as substrates eight inch diameter (100) silicon semiconductor substrates having formed thereover silicon oxide dielectric layers. There was then formed upon the silicon oxide dielectric layers a series of blanket doped polysilicon layers as blanket target layers, each formed to a thickness of about 20000 angstroms. There was then in turn formed upon the blanket doped polysilicon layers a series of blanket organic polymer anti-reflective coating (ARC) layers formed of an organic polymer antireflective coating material available from Brewer Science, Inc., Rolla, MO, Brewer Science as DUV 42-8 anti-reflective coating (ARC) material. The organic polymer anti-reflective coating (ARC) material was coated and thermally cured at a temperature of about 110 degrees centigrade to provide the series of blanket organic polymer anti-reflective coating (ARC) layers of thickness about 1500 angstroms. Finally, there was then formed upon the series of blanket organic polymer anti-reflective (ARC) coating layers a series of patterned photoresist layers formed of Sepv 432 photoresist material available from Shinetsu formed to a thickness of about 6500 angstroms and formed employing patterns of measured linewidth about 0.25 microns by about 0.29 microns.

The blanket organic polymer anti-reflective coating (ARC) layers were then etched while employing the patterned photoresist layers as a series of first etch mask layers and while employing a first plasma etch method employing an etchant gas composition comprising hydrogen bromide, oxygen and nitrogen. The first plasma etch method also employed: (1) a reactor chamber pressure of about 6 mtorr; (2) a top source radio frequency power of about 275 watts at a source radio frequency of 13.56 MHZ and a bias power of about 75 watts; (3) a semiconductor substrate temperature of about 65 degrees centigrade; (4) a hydrogen bromide flow rate of about 50 standard cubic centimeters per minute (sccm); (5) a nominal oxygen flow rate of about 10 standard cubic centimeters per minute (sccm) with multiple offset adjustments thereupon; and (6) a nitrogen flow rate of about 6 standard cubic centimeters per minute (seem). The series of blanket organic polymer blanket anti-reflective coating (ARC) layers were etched to form a series of patterned organic polymer anti-reflective coating (ARC) layers until there was reached an optical emission spectroscopy endpoint.

The series of blanket polysilicon layers were then etched in-situ while employing a second plasma etch method employing an etchant gas composition comprising chlorine and hydrogen bromide. The second plasma etch method also employed: (1) a reactor chamber pressure of about 20 mtorr; (2) a top source radio frequency power of about 250 watts at a source top radio frequency of 13.56 MHZ and a bias power of about 80 watts; (3) a semiconductor substrate temperature of about 65 degrees centigrade; (4) a chlorine flow rate of about 80 standard cubic centimeters per minute (sccm); and (5) a hydrogen bromide flow rate of about 120 standard cubic centimeters per minute (sccm). The blanket polysilicon layers were etched to form the series of patterned polysilicon layers until there was reached an optical emission spectroscopy endpoint.

Finally, the patterned polysilicon layers were over-etched in-situ while employing a third plasma etch method employing an etchant gas composition comprising hydrogen bromide, helium and oxygen. The third plasma etch method also employed: (1) a reactor chamber pressure of about 60 mtorr; (2) a top source radio frequency power of about 250 watts at a top radio frequency of 13.56 MHZ and a bias power of about 80 watts; (3) a semiconductor substrate temperature of about 65 degrees centigrade; (4) a hydrogen bromide flow rate of about 200 standard cubic centimeters per minute (sccm); (5) a helium:oxygen (80:20, vol:vol) flow rate of about 3.3 standard cubic centimeters per minute (sccm); and (6) a helium flow rate of about 100 standard cubic centimeters per minute (sccm), for an over-etch time of about 70 seconds.

The series of patterned photoresist layers and the series of patterned anti-reflective coating layers were then stripped from the series of microelectronic fabrications and the linewidths of the patterned polysilicon layers were then measured.

There was then plotted for the group of patterned polysilicon layers a correlation of critical dimension bias (i.e., patterned polysilicon layer after etch inspection (AEI) linewidth minus patterned photoresist layer after development inspection (ADI) linewidth) as a function of oxygen offset flow rate within the second plasma etch method. The results are plotted in the graph of FIG. 4.

Figure 4:
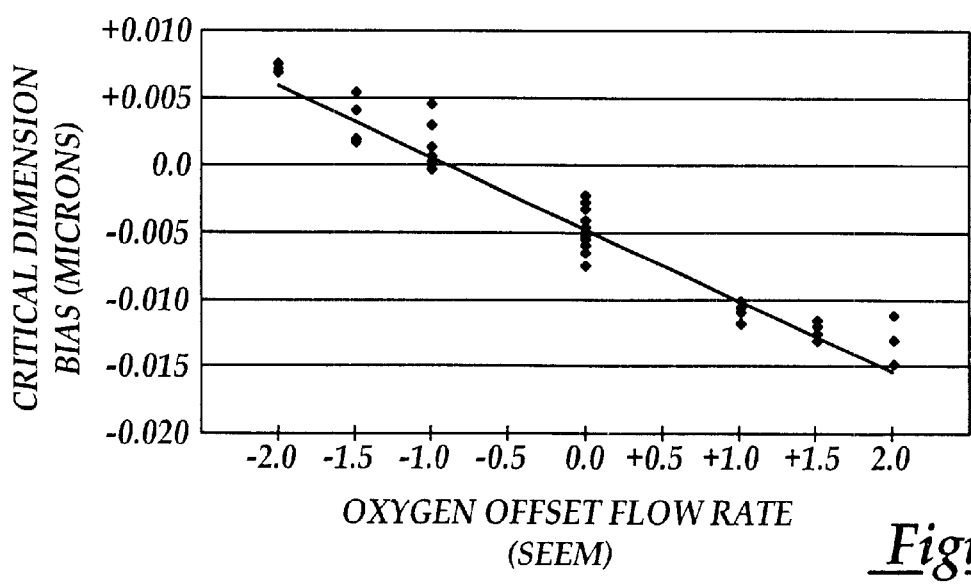
FIG. 4 shows a graph of Critical Dimension Bias versus Oxygen Offset Flow Rate when forming a patterned polysilicon layer from a blanket polysilicon layer while employing a blanket organic polymer anti-reflective coating (ARC) layer in accord with a first example of the present invention.

As is illustrated within the graph of FIG. 4, there is a sufficient correlation of patterned polysilicon layer critical dimension bias as a function of oxygen offset flow rate to provide an operable invention within the context of the instant disclosure when employing as an anti-reflective coating (ARC) layer an organic polymer anti-reflective coating (ARC) layer.

As an additional example of the present invention also directed toward illustrating the value of the present invention when forming a patterned target layer, but instead within the context of an anti-reflective coating (ARC) layer formed of a silicon containing dielectric anti-reflective coating (ARC) material, there was then fabricated an additional series of microelectronic fabrications in accord with the schematic cross-sectional diagram of FIG. 1. The additional series of microelectronic fabrications also employed as substrates eight inch diameter (100) silicon semiconductor substrates having formed thereover silicon oxide dielectric layers. There was then formed upon the silicon oxide dielectric layers a series of doped polysilicon layers also formed to a thickness of about 2000 angstroms. There was then in turn formed upon the series of doped polysilicon layers a series of blanket anti-reflective coating (ARC) layers formed of a silicon oxynitride dielectric material formed employing a plasma enhanced chemical vapor deposition (PECVD) method employing silane as a silicon source material, nitrous oxide as an oxygen source materials and ammonia as a nitrogen source material. The silicon containing dielectric anti-reflective coating (ARC) layers were formed to a thickness of about 320 angstroms. Finally, there was then formed upon the silicon containing dielectric anti-reflective (ARC) coating layers a series of patterned photoresist layers of measured bidirectional linewidth about 0.16 microns by about 0.20 microns.

The blanket silicon containing dielectric anti-reflective coating (ARC) layers were then etched while employing the series of patterned photoresist layers as a series of first etch mask layers and while employing a first plasma etch method employing an etchant gas composition comprising hexafluoroethane, hydrogen bromide and minor amounts of helium and oxygen. The first plasma etch method also employed: (1) a reactor chamber pressure of about 10 mtorr; (2) a top source radio frequency power of about 350 watts at a source radio frequency of 13.56 MHZ and a bias power of about 80 watts; (3) a substrate temperature of about 65 degrees centigrade; (4) a hexafluoroethane flow rate of about 80 standard cubic centimeters per minute (sccm); (5) a hydrogen bromide target flow rate of about 20 standard cubic centimeters per minute (sccm) with incremental variations thereupon of from about +20 to about −20 standard cubic centimeters per minute (sccm) incremented in 10 standard cubic centimeters per minute (sccm) steps; (6) a helium-oxygen (80:20, vol:vol) flow rate of about 10 standard cubic centimeters per minute (sccm). The blanket silicon containing dielectric anti-reflective coating (ARC) layers were etched while employing the first plasma etch method to form the series of patterned silicon containing dielectric anti-reflective coating (ARC) layers while employing an endpoint detected employing an optical emission spectroscopy method.

The blanket polysilicon layers were then etched in-situ while employing a second plasma etch method employing an etchant gas composition comprising chlorine, hydrogen bromide and minor amounts of helium and oxygen. The second plasma etch method also employed: (1) a reactor chamber pressure of about 20 mtorr; (2) a top source radio frequency power of about 200 watts at a source radio frequency of 13.56 MHZ and a bias power of about 150 watts; (3) a substrate temperature of about 65 degrees centigrade; (4) a chlorine flow rate of about 50 standard cubic centimeters per minute (seem); (5) a hydrogen bromide flow rate of about 150 standard cubic centimeters per minute (seem); and (6) a helium-oxygen (80:20, vol:vol) flow rate of about 5 standard cubic centimeters per minute (seem). The blanket polysilicon layers were etched to form the series of patterned polysilicon layers while employing an endpoint detected employing an optical emission spectroscopy method.

Finally, the patterned polysilicon layers were over-etched in-situ while employing a third plasma etch method employing an etchant gas composition comprising hydrogen bromide, helium and oxygen. The third plasma etch method also employed: (1) a reactor chamber pressure of about 80 mtorr; (2) a top source radio frequency power of about 250 watts at a top radio frequency of 13.56 MHZ and a bias power of about 120 watts; (3) a semiconductor substrate temperature of about 65 degrees centigrade; (4) a hydrogen bromide flow rate of about 120 standard cubic centimeters per minute (sccm); (5) a helium:oxygen (80:20, vol:vol) flow rate of about 5 standard cubic centimeters per minute (sccm); and (6) a helium flow rate of about 100 standard cubic centimeters per minute (sccm). The patterned polysilicon layers were over-etched for a time period of about 110 seconds.

The patterned photoresist layers and the patterned silicon containing dielectric anti-reflective coating (ARC) layers were then stripped from the microelectronic fabrications and the linewidths of the patterned polysilicon layers were then measured.

There was then plotted for the group of patterned polysilicon layers a correlation of critical dimension bias (i.e., patterned polysilicon layer after etch inspection (AEI) measured linewidth minus patterned photoresist layer after development inspection (ADI) measured linewidth) as a function of hydrogen bromide flow rate within the second plasma etch method. The results are plotted in the graph of FIG. 5.

Figure 5:
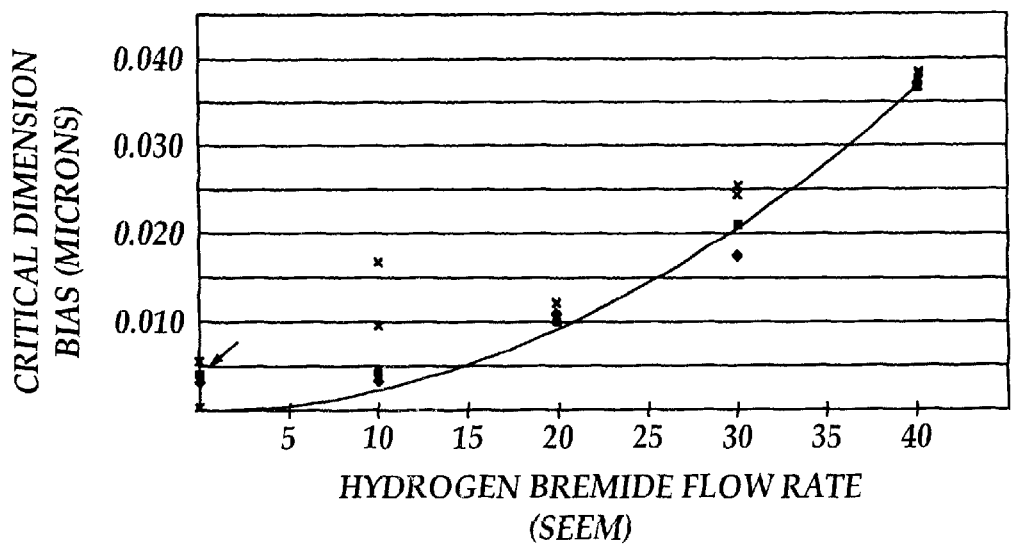
FIG. 5 shows a graph of Critical Dimension Bias versus Hydrogen Bromide Flow Rate when forming a patterned polysilicon layer from a blanket polysilicon layer while employing a silicon oxynitride silicon containing dielectric anti-reflective coating (ARC) layer in accord with a second example of the present invention.

As is illustrated within the graph of FIG. 5, there is a sufficient correlation of critical dimension bias as a function of hydrogen bromide flow rate to provide an operable invention within the context of the instant disclosure.

Finally, there was obtained several series of microelectronic fabrications fabricated in accord with the second example, where the series of patterned photoresist layers was formed upon the series of patterned silicon containing dielectric anti-reflective coating (ARC) layers and there was similarly measured for this series of microelectronic fabrications a series of linewidth measurements for the series of patterned photoresist layers. The series of microelectronic fabrications were then arbitrarily divided into three groups consisting of: (1) microelectronic fabrications having formed thereupon comparatively narrow patterned photoresist layers; (2) microelectronic fabrications having formed thereupon nominally target linewidth patterned photoresist layers; and (3) microelectronic fabrications having formed thereupon comparatively wide patterned photoresist layers.

Each of the microelectronic fabrications was then further processed while employing the correlation in accord with that of the second example as illustrated within the graph of FIG. 5, as applied within the context of an interest in providing a closer distribution of patterned polysilicon layer measured linewidths after a blanket polysilicon layer plasma etch and plasma over-etch (i.e., AEI), in comparison with patterned photoresist layer measured linewidths after a blanket photoresist layer development (i.e., ADI). Similarly, the series of silicon containing dielectric anti-reflective coating (ARC) layers and the series of polysilicon layers were etched in accord with the second example. The linewidths of the series of patterned polysilicon layers so formed were then measured in accord with the second example.

Figure 6:
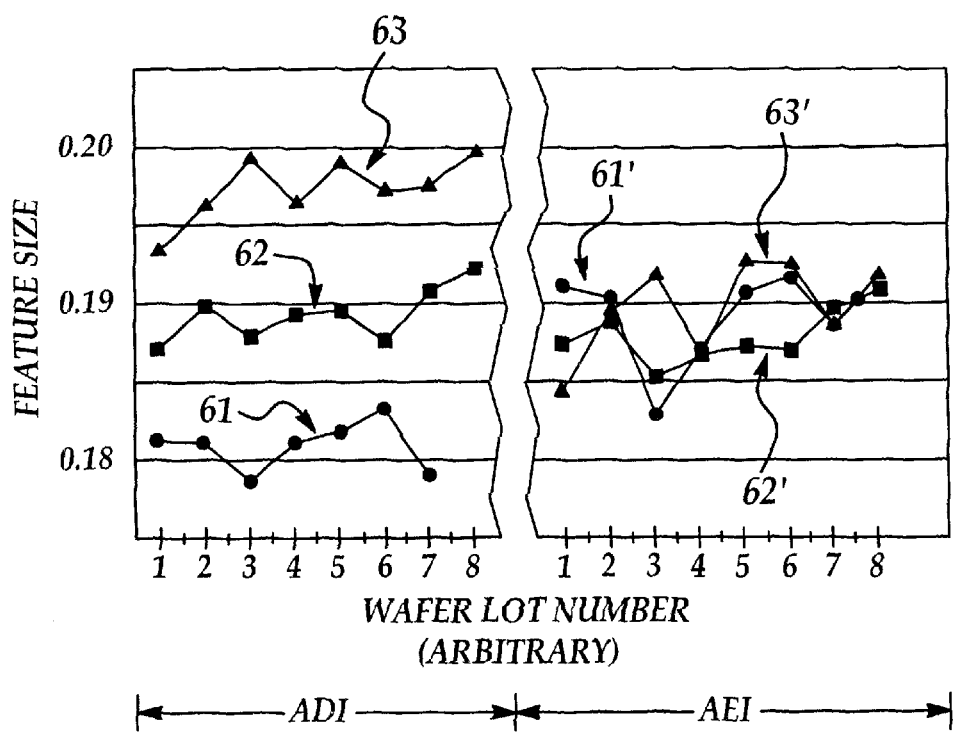
FIG. 6 shows a graph of Feature Size versus Wafer Lot Number for both patterned photoresist layer after development inspection (ADI) measurements and patterned polysilicon layer after etch inspection (AEI) measurements for forming a series of patterned polysilicon layers in accord with the second example of the present invention.

The results of the after development inspection (ADI) measurements of the patterned photoresist layers and the after etch inspection (AEI) measurements of the patterned polysilicon layers are shown in the graph of FIG. 6.

As is illustrated within FIG. 6 with respect to the after development inspection (ADI) measurements, reference numeral 61 corresponds with the series of patterned photoresist layers having the comparatively narrow measured linewidths. In addition, reference numeral 62 corresponds with the series of patterned photoresist layers having the nominal target measured linewidths. Further, reference numeral 63 corresponds with the series of patterned photoresist layers having the comparatively wide measured linewidths. Similarly within FIG. 6 with respect to the after etch inspection (AEI) measurements, reference numeral 61' corresponds with the series of patterned polysilicon layers originally having the comparatively narrow patterned photoresist layers formed thereover. In addition, reference numeral 62' corresponds with the series of patterned polysilicon layers originally having the nominally target linewidth patterned photoresist layers formed thereover. Further, reference numeral 63' corresponds with the series of patterned polysilicon layers originally having the comparatively wide patterned photoresist layers formed thereover.

As is seen from review of the data in FIG. 6, there is observed a significant narrowing of patterned polysilicon layer after etch inspection (AEI) measured linewidth distribution in comparison with corresponding patterned photoresist layer after development inspection (ADI) measured linewidth distribution, as is desirable within the context of the objects of the present invention. Similarly, and within the context of the present invention, such narrowing of patterned polysilicon after etch inspection (AEI) measured linewidth distribution is effected independent of the nature of distribution of patterned photoresist layer after development inspection (ADI) measured linewidth, such that it is not required within the present invention that a patterned photoresist layer be initially formed of only an enhanced linewidth and subsequently additionally etched to form a patterned photoresist layer or a particular target linewidth.

As is understood by a person skilled in the art, the preferred embodiments and examples of the present invention are illustrative of the present invention rather than limiting of the present invention. Revisions and modifications may be made to methods, materials, structures and dimensions through which is provided a patterned layer within a microelectronic fabrication in accord with the preferred embodiments and examples of the present invention, while still providing patterned layers within microelectronic fabrications in accord with the present invention, further in accord with the appended claims.

What is claimed is:

1. A method for forming a patterned layer comprising:
   providing a stack comprising a substrate, the substrate having formed thereover a blanket target layer, the blanket target layer in turn having formed thereover a blanket organic anti-reflective coating (ARC) layer, the blanket organic anti-reflective coating (ARC) layer in turn having formed thereover a patterned photoresist layer;
   establishing for the stack a correlation which interrelates a patterned photoresist layer target linewidth and an oxygen containing species target concentration in a fashion to provide a patterned target layer having a patterned target layer target linewidth within a sequence of:
      a first plasma etch method for forming from the blanket organic anti-reflective coating (ARC) layer a patterned organic anti-reflective coating (ARC) layer while employing a first etchant gas composition which upon plasma activation provides the oxygen containing species; and
      a second plasma etch method for forming from the blanket target layer the patterned target layer;
   determining for the patterned photoresist layer a patterned photoresist layer measured linewidth and a deviation of the patterned photoresist layer measured linewidth from the patterned photoresist layer target linewidth;
   etching, while employing the first plasma etch method, the blanket organic anti-reflective coating (ARC) layer to form the patterned organic anti-reflective coating (ARC) layer, where the oxygen containing species concentration within the first plasma etch method is adjusted within the context of the correlation to compensate for the deviation of the patterned photoresist layer measured linewidth from the patterned photoresist layer target linewidth such that the blanket target layer may be etched while employing the second plasma etch method to form the patterned target layer having a patterned target layer measured linewidth closer to the patterned target layer target linewidth; and
   etching, while employing the second plasma etch method, the blanket target layer to form the patterned target layer.

2. The method of claim 1 wherein the substrate is employed within a microelectronic fabrication selected from the group consisting of integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

3. The method of claim 1 wherein the blanket target layer is formed from a material selected from the group consisting of conductor materials, semiconductor materials and dielectric materials.

4. The method of claim 1 wherein the organic anti-reflective coating (ARC) material is selected from the group consisting of amorphous carbon materials and organic polymer spin-on-polymer (SOP) materials.

5. The method of claim 1 wherein the oxygen containing etchant species is selected from the group consisting of oxygen, ozone, nitrous oxide and nitric oxide.

6. The method of claim 1 wherein the first etchant gas composition also comprises a bromine containing etchant species.

7. The method of claim 6 wherein the bromine containing etchant species derives from a bromine containing gas selected from the group consisting of hydrogen bromide and bromine.

8. The method of claim 1 wherein:
   the blanket target layer is formed from a conductor material selected from the group consisting of doped polysilicon, polycide, aluminum and aluminum alloy conductor materials, and
   the second plasma etch method employs a second etchant gas composition which upon plasma activation provides an active chlorine containing species and an active bromine containing species.

9. A method for forming a patterned layer comprising:
   providing a stack comprising a substrate, the substrate having formed thereover a blanket target layer, the blanket target layer in turn having formed thereover a blanket silicon containing dielectric anti-reflective coating (ARC) layer, the blanket silicon containing dielectric anti-reflective coating (ARC) layer in turn having formed thereover a patterned photoresist layer;
   establishing for the stack a correlation which interrelates a patterned photoresist layer target linewidth and a bromine containing etchant species target concentration in a fashion to provide a patterned target layer having a patterned target layer target linewidth within a sequence of:
      a first plasma etch method for forming from the blanket silicon containing dielectric anti-reflective coating (ARC) layer a patterned silicon containing dielectric anti-reflective coating (ARC) layer while employing a first etchant gas composition which upon plasma activation provides the bromine containing etchant species; and a second plasma etch method for forming the blanket target layer the patterned target layer;

determining for the patterned photoresist layer a patterned photoresist layer measured linewidth and a deviation of the patterned photoresist layer measured linewidth from the patterned photoresist layer target linewidth;

etching, while employing the first plasma etch method, the blanket silicon containing dielectric anti-reflective coating (ARC) layer to form the patterned silicon containing dielectric anti-reflective coating (ARC) layer, where the bromine containing etchant species concentration within the first plasma etch method is adjusted within the context of the correlation to compensate for the deviation of the patterned photoresist layer measured linewidth from the patterned photoresist layer target linewidth such that the blanket target layer may be etched while employing the second plasma etch method to form the patterned target layer having a patterned target layer measured linewidth closer to the patterned target layer target linewidth; and etching, while employing the second plasma etch method, the blanket target layer to form the patterned target layer.

10. The method of claim 9 wherein the substrate is employed within a microelectronic fabrication selected from the group consisting of integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

11. The method of claim 9 wherein the blanket target layer is formed from a material selected from the group consisting of conductor materials, semiconductor materials and dielectric materials.

12. The method of claim 9 wherein the blanket silicon containing dielectric anti-reflective coating (ARC) layer is formed from a material selected from the group consisting of silicon oxide dielectric materials, silicon nitride dielectric materials and silicon oxynitride dielectric materials.

13. The method of claim 9 wherein the bromine containing etchant species derives from a bromine containing gas selected from the group consisting of bromine and hydrogen bromide.

14. The method of claim 9 wherein the first etchant gas composition also comprises a fluorine containing gas which upon plasma activation provides a fluorine containing species.

15. The method of claim 14 wherein the fluorine containing gas is selected from the group consisting of perfluorocarbons of up to about 4 carbon atoms, hydrofluorocarbons of up to about 4 carbon atoms, nitrogen trifluoride and sulfur hexafluoride.

16. The method of claim 9 wherein:

the blanket target layer is formed from a conductor material selected from the group consisting of doped polysilicon, polycide, aluminum and aluminum alloy conductor materials; and the second plasma etch method employs a second etchant gas composition which upon plasma activation provide an active chlorine containing species and an active bromine containing species.

* * * * *